(12) United States Patent
Gillard et al.

(10) Patent No.: US 9,089,074 B2
(45) Date of Patent: Jul. 21, 2015

(54) HEAT SINK STRUCTURE WITH RADIO FREQUENCY ABSORPTION

(71) Applicant: International Business Machines Corporation, Armonk, NY (US)

(72) Inventors: Edward C. Gillard, Mantorville, MN (US); Don A. Gilliland, Rochester, MN (US); David B. Johnson, Rochester, MN (US); Dennis J. Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 13/679,591

(22) Filed: Nov. 16, 2012

(65) Prior Publication Data

US 2014/0140007 A1    May 22, 2014

(51) Int. Cl.
*F28F 21/00*    (2006.01)
*H05K 7/20*    (2006.01)
*H05K 9/00*    (2006.01)
*H01L 23/373*    (2006.01)
(Continued)

(52) U.S. Cl.
CPC ............ *H05K 7/2039* (2013.01); *H01L 23/373* (2013.01); *H01L 23/3737* (2013.01); *H01L 23/552* (2013.01); *H05K 7/20418* (2013.01); *H05K 9/0084* (2013.01); *H01L 23/3735* (2013.01); *H01L 2224/32245* (2013.01)

(58) Field of Classification Search
CPC ............ H05K 7/20; F28F 13/18; F28F 21/00; H01L 23/552
USPC ........ 361/679.46, 679.448, 679.54, 690–697, 361/704–712, 800, 816, 818; 165/80.2, 165/80.3, 104.33, 185, 121–126; 257/706–727; 174/16.3, 35 R, 35 MS, 174/35 GC; 428/327, 318.8, 357, 361; 427/180
See application file for complete search history.

(56) References Cited

U.S. PATENT DOCUMENTS 5,175,613 A * 12/1992 Barker et al. ................. 257/713
6,545,212 B1 * 4/2003 Uchida et al. ................. 174/391
6,561,267 B2   5/2003 Sauciuc et al.
(Continued)

FOREIGN PATENT DOCUMENTS

JP    05218246 A    8/1993
JP    2009139083 A    6/2009
WO    2004063639 A2    7/2004

OTHER PUBLICATIONS

Kim et al., "Fluid-flow and endwall heat-transfer characteristics of an ultralight lattice-frame material", International Journal of Heat and Mass Transfer 47 (2004), pp. 1129-1140, © 2003 Elsevier Ltd. DOI: 10.1016/j.ijheatmasstransfer.2003.10.012.

(Continued)

*Primary Examiner* — Michail V Datskovskiy
(74) *Attorney, Agent, or Firm* — Penny L. Lowry; Robert Williams

(57) ABSTRACT

According to embodiments of the invention, a heat sink structure may be provided. The heat sink structure may include a first surface adapted to connect to an electronic component. The heat sink structure may also include a second surface adapted to provide heat transfer. The heat sink structure may also include a coating of radio-frequency absorbing material covering at least a portion of the second surface.

15 Claims, 3 Drawing Sheets

(51) Int. Cl.
*H01L 23/552* (2006.01)
*F28F 13/18* (2006.01)

(56) References Cited

U.S. PATENT DOCUMENTS

| | | | |
|---|---|---|---|
| 6,670,545 B2 * | 12/2003 | Botrie | 174/388 |
| 7,028,754 B2 | 4/2006 | Boudreaux | |
| 7,442,882 B2 | 10/2008 | Gilliland et al. | |
| 7,443,684 B2 | 10/2008 | Huang | |
| 7,463,496 B2 * | 12/2008 | Robinson et al. | 361/818 |
| 7,842,381 B2 | 11/2010 | Johnson | |
| 8,013,258 B2 * | 9/2011 | Wu | 174/382 |
| 2003/0010515 A1 * | 1/2003 | Botrie | 174/32 |
| 2003/0113531 A1 * | 6/2003 | Hajmrle et al. | 428/327 |
| 2004/0001299 A1 * | 1/2004 | van Haaster et al. | 361/118 |
| 2004/0012939 A1 * | 1/2004 | Ta et al. | 361/800 |
| 2006/0254762 A1 | 11/2006 | Tao et al. | |
| 2007/0062676 A1 | 3/2007 | Yao | |
| 2007/0211445 A1 * | 9/2007 | Robinson et al. | 361/818 |
| 2008/0290875 A1 * | 11/2008 | Park | 324/344 |
| 2009/0122490 A1 | 5/2009 | Chyn et al. | |
| 2010/0025100 A1 * | 2/2010 | Hamano et al. | 174/388 |
| 2011/0195264 A1 * | 8/2011 | Aravinda | 428/546 |
| 2012/0012382 A1 * | 1/2012 | McBain et al. | 174/388 |
| 2012/0120604 A1 | 5/2012 | Hao et al. | |

OTHER PUBLICATIONS

Kim et al., "Connective heat dissipation with lattice-frame materials", Mechanics of Materials 36 (2004), pp. 767-780, (Recieved Jan. 30, 2003, Revised Jun. 26, 2003), © 2003 Elsevier Ltd. DOI: 10.1016/j.mechmat.2003.07.001.

Tian et al., "The effects of topology upon fluid-flow and heat transfer within cellular copper structures", International Journal of Heat and Mass Transfer 47 (2004), pp. 3171-3186, (Received Sep. 19, 2002, Revised Feb. 12, 2004, Published Online Mar. 20, 2004), © 2004 Elsevier Ltd. DOI: 10.1016/j.ijheatmasstransfer.2004.02.101.

* cited by examiner

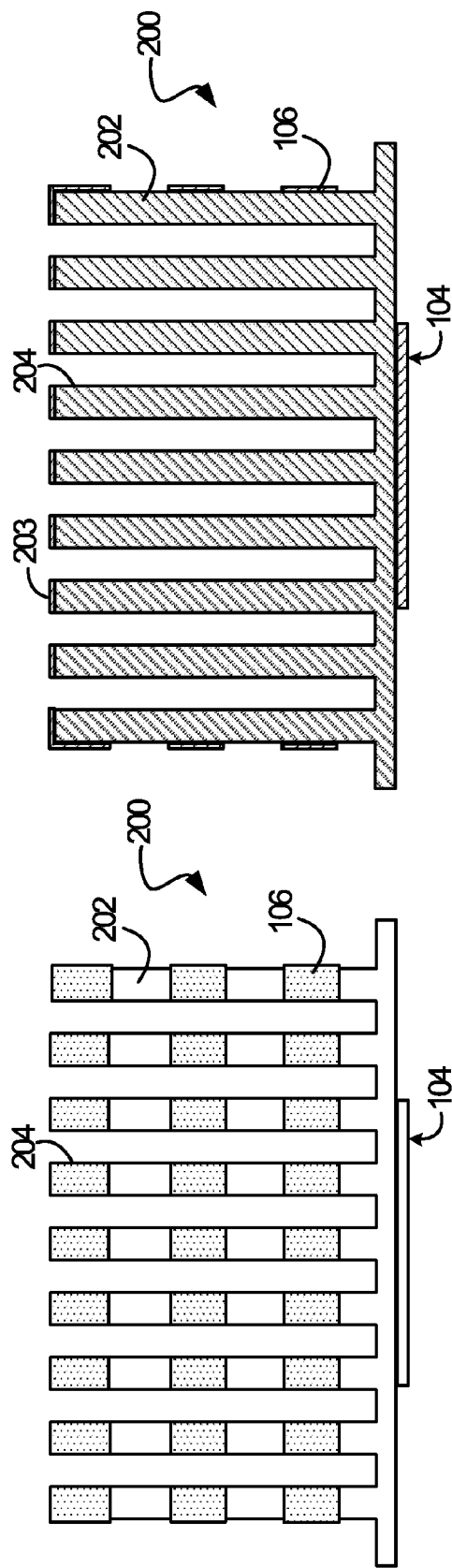
FIG. 2A
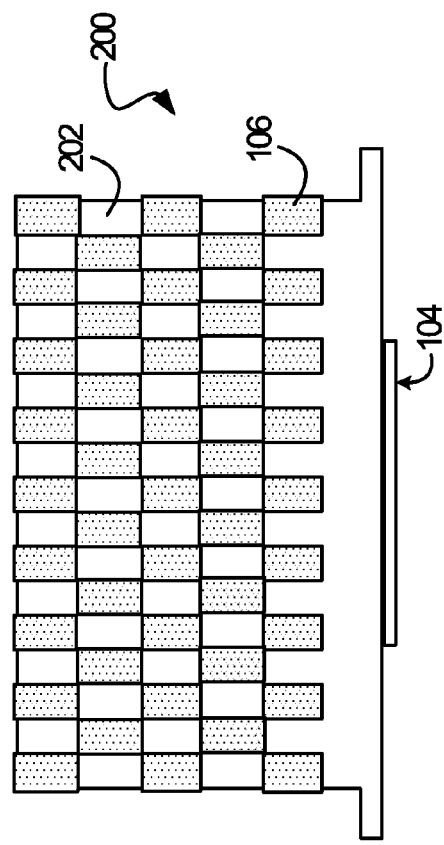
FIG. 2B
FIG. 2C

HEAT SINK STRUCTURE WITH RADIO FREQUENCY ABSORPTION

TECHNICAL FIELD

The field of the invention relates generally to electronic components, and more specifically, to heat sinks and radio frequency absorption.

BACKGROUND

Computer systems typically include a combination of computer programs and hardware, such as semiconductors, transistors, chips, circuit boards, storage devices, and processors. The computer programs are stored in the storage devices and are executed by the processors. A common feature of many computer systems is the presence of one or more circuit boards. Circuit boards may contain a variety of electronic components mounted to them. It is also common for one or more of the electronic components to have a heat sink structure connected to them.

SUMMARY

According to embodiments of the invention, a heat sink structure may be provided. The heat sink structure may include a first surface adapted to connect to an electronic component. The heat sink structure may also include a second surface adapted to provide heat transfer. The heat sink structure may also include a coating of electromagnetic radiation shielding material covering at least a portion of the second surface.

According to other embodiments, the heat sink structure may include a plurality of members arranged in a 3D lattice pattern and having a plurality of interior surfaces and a plurality of exterior surfaces. The heat sink structure may also include a coating of electromagnetic radiation shielding material covering at least a portion of one or more of the exterior surfaces.

According to other embodiments, a method may be provided for creating a heat sink structure with EMI shielding. The method may include providing a heat sink structure comprising a first surface adapted to connect to an electronic component and a second surface adapted to provide heat transfer. The method may also include applying a coating of electromagnetic radiation shielding material to at least a portion of the second surface.

BRIEF DESCRIPTION OF THE SEVERAL VIEWS OF THE DRAWINGS

FIG. 2A is an end view of a heat sink structure, according to another embodiment of the invention.

FIG. 2B is a view of a cross section of the heat sink structure of FIG. 2A, according to an embodiment of the invention.

FIG. 2C is a side of the heat sink structure of FIG. 2A, according to an embodiment of the invention.

In the drawings and the Detailed Description, like numbers generally refer to like components, parts, steps, and processes.

DETAILED DESCRIPTION

Modern day electronic components often produce two potentially unwanted byproducts: heat and radio-frequency (RF) emissions which may lead to electromagnetic interference (EMI). The heat that is produced from electronic components is often removed using a combination of heat conducting elements, such as heat sinks, and airflow producing elements, such as fans. The RF emissions are often contained using various shielding elements, such as RF shields or attenuated using RF absorber. Electromagnetic shielding materials typically have thermally insulative properties.

Embodiments of the invention provide an improved structure for managing both the heat and the electromagnetic radiation generated from today's electronic components. Embodiments of the invention accomplish this by providing a heat sink structure that includes a coating of RF absorbing material on a portion of the outer surfaces of a heat sink. This structure results in both a heat conducting structure to cool the electronic component and an RF absorbing structure to contain emissions produced by the electronic component. The coating of RF absorbing material may have limited interference with the ability of the heat sink to dissipate heat because of its application to only a portion of the outermost surfaces of the heat sink. For example, an embodiment may include a heat sink consisting of a plurality of members arranged in a 3D lattice pattern. A portion of the outermost surfaces of the outermost members may be covered by a coating of RF absorbing material.

Figure 1A:
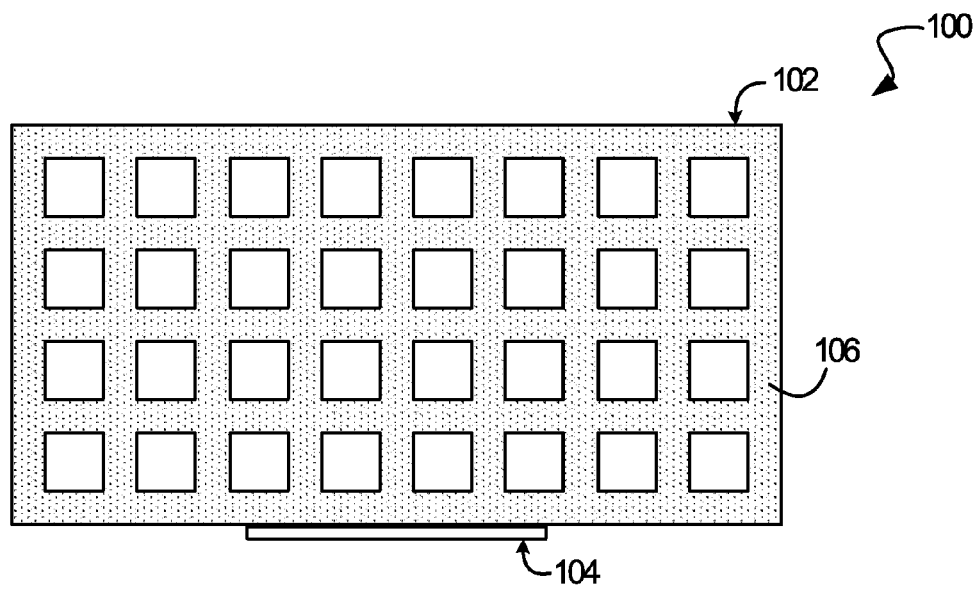
FIG. 1A is a side view of a heat sink structure, according to an embodiment of the invention.

Referring to the drawings, wherein like numbers denote like parts throughout the several views, FIG. 1A is a side view of a heat sink structure 100, according to an embodiment of the invention. The heat sink structure 100 may include a plurality of members arranged in a 3D lattice pattern 102. The heat sink structure 100 may be connected to an electronic component 104 on an outer surface of the heat sink structure 100. The members of the 3D lattice pattern 102 may be made from any heat conducting material such as a metal such as aluminum. Also, the members of the 3D lattice pattern 102 may have a cross sectional area with rounded edges. In other embodiments, they may have a cross sectional area that has one or more straight edges.

The 3D lattice pattern 102 depicted in FIG. 1 consists of five horizontal members and nine vertical members but in other embodiments the number of horizontal and vertical members may vary. Also, the heat sink structure 100 depicted in FIG. 1 is a square configuration such that the view depicted would be the same view if the heat sink structure 100 was rotated ninety degrees horizontally. By contrast, in other embodiments, the heat sink structure 100 may be rectangular such that the number of horizontal members may vary when the viewed from different sides. Also, the holes within the 3D lattice pattern 102 depicted in FIG. 1 are uniform but in other embodiments the holes may vary in size in order to accommodate various heat transfer systems. For example, the holes closer to the electronic component 104 may be the smallest and the holes may become larger as they move away from the electronic component 104. Also, in other embodiments, the holes may be of a shape other than squares, such as rectangles circles, any other polygons, or any other shape.

The heat sink structure 100 may also include a coating of RF absorbing material 106. In FIG. 1A the coating of RF absorbing material 106 is depicted on the entire outer surface of the 3D lattice pattern 102 except for the portion of the surface that connects to the electronic component 104. In other embodiments, the coating of RF absorbing material 106 may cover only a portion of the outer surface of the 3D lattice pattern 102. For example, the coating of RF absorbing material 106 may only be needed to be applied in such a way that the coating has one or more holes of a certain size in it that enables the coating to absorb a certain wavelength of radiation. An example of the certain size hole is 0.118-0.236 in (3-6 mm). In most embodiments, because of the insulative nature of RF absorbing material, the percentage of the total surface area of the heat sink structure 100 that is covered by the coating may be relatively low in order to limit its affect on the heat transfer capabilities of the heat sink structure 100. The coating of RF absorbing material 106 may be of any thickness which may provide a sufficient barrier to the emissions produced by the electronic component 104 or any other neighboring components which may produce EMI. For example, the coating of RF absorbing material 106 may be applied so that its thickness throughout the heat sink structure ranges from 0.039-0.118 in (1-3 mm). The RF absorbing material may include any material that may absorb electromagnetic radiation and may be adapted to be applied as a coating to a heat sink. For example, an RF absorbing material may be a magnetically loaded elastomer such as an elastomer infused with ferrite, which may be melted and then applied to a heat sink. In another embodiment, an RF absorbing material may be applied to a heat sink using an adhesive. An example of a commercially available material that may be used for RF absorbing is Wave-X®, by ARC Technologies of Amesbury, Mass.

Figure 1B:
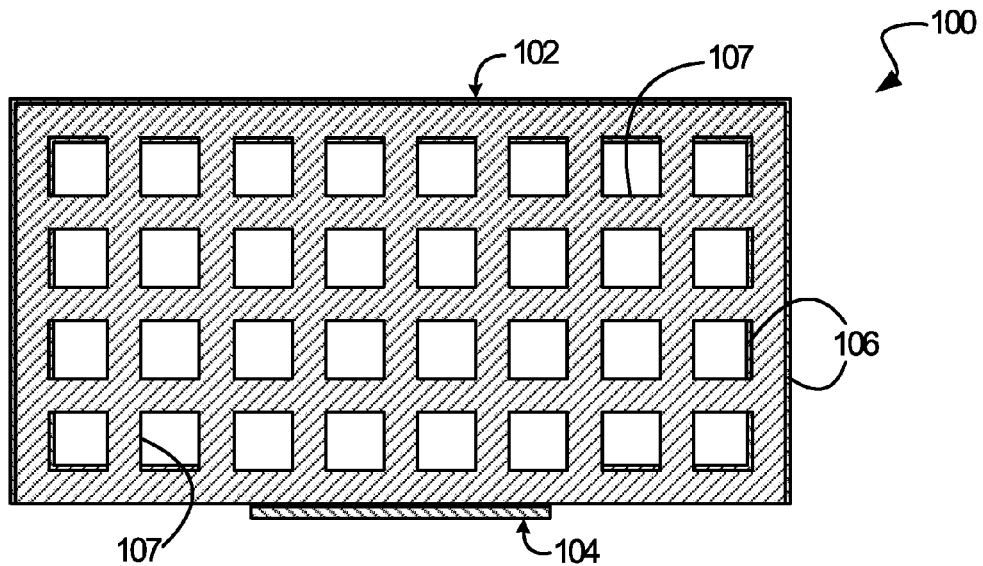
FIG. 1B is a view of a cross section of the heat sink structure of FIG. 1A, according to an embodiment of the invention.

FIG. 1B is a view of a cross section of the heat sink structure 100 of FIG. 1A, according to an embodiment of the invention. This view depicts an example of the application of the coating of RF absorbing material 106 to a portion of the surfaces of the 3D lattice pattern 102 of the heat sink structure 100. The coating of RF absorbing materials 106 is applied to surfaces of the heat sink that are opposite and adjacent the surface of the heat sink that is connected to the electronic component 104. It may also be seen that a coating of RF absorbing material 106 is not applied to one or more inner or interior surfaces 107. This application configuration may allow the heat sink structure 100 to operate as both a heat transferring structure and an RF absorbing structure. By limiting the application of the coating of RF absorbing material 106 to one or more portions of the outer or exterior surfaces of the 3D lattice pattern 102, one or more inner or interior surfaces of the pattern are allowed to conduct the heat transfer to cool the electronic component 104, while the coating of RF absorbing material 106 absorbs RF emissions from the electronic component 104. Although not depicted in the drawings, in order to increase the heat transfer capabilities of the heat sink structure 100 a fan may be connected to one of the outer surfaces of the heat sink structure 100.

FIG. 2A is an end view of a heat sink structure 200, according to another embodiment of the invention. The heat sink structure 200 may include a plurality of fins 202 arranged in a parallel pattern. The heat sink structure 200 may be connected to an electronic component 104 on a surface of the heat sink structure 200. The fins 202 may be made from any heat conducting material such as a metal such as aluminum. The heat sink structure 200 depicted in FIG. 2A consists of nine fins but in other embodiments the number of fins may vary. Also, the fins 202 depicted in FIG. 2A are uniform in thickness such that all the fins have the same thickness and the thickness of each fin is the same at the bottom and the top of each fin. In other embodiments the thickness of the fins 202 may vary from fin to fin and the thickness may vary from the bottom of each fin to the top of each fin. The heat sink structure 200 may also include a coating of RF absorbing material 106. In FIG. 2A the coating of RF absorbing material 106 is depicted as being applied to portions of the ends of the fins 202, but in other embodiments the coating of RF absorbing material 106 may cover the entire outer surface of the ends of the fins 202.

FIG. 2B is a view of a cross section of the heat sink structure 200 of FIG. 2A, according to an embodiment of the invention. This view shows an example of the application of the coating of RF absorbing material 106 to portions of the surfaces of the fins 202 of the heat sink structure 200. As depicted, the coating of RF absorbing material 106 is applied to a portion 203 of the top of each fin and to portions of the sides of the outermost fins. It may also be seen that a coating of RF absorbing material is absent from one or more interior surfaces 204. As previously stated, this application configuration may allow the heat sink structure 200 to operate as both a heat transferring structure and an RF absorbing structure.

FIG. 2C is a side of the heat sink structure of FIG. 2A, according to an embodiment of the invention. This view shows an example of the application of the coating of RF absorbing material 106 to portions of the surfaces of a side of one of the two fins located at the edge of the heat sink structure 200. The application configuration of the RF absorbing material 106 depicted in FIG. 2C is one example of how the RF absorbing material may be applied in a pattern to allow both heat transfer and RF absorbing. In other embodiments the RF absorbing material 106 may be applied in a pattern similar to concentric circles. Although not depicted in the drawings, in order to increase the heat transfer capabilities of the heat sink structure 200 a fan may be connected to one of the outer surfaces of the heat sink structure 200.

Figure 3:
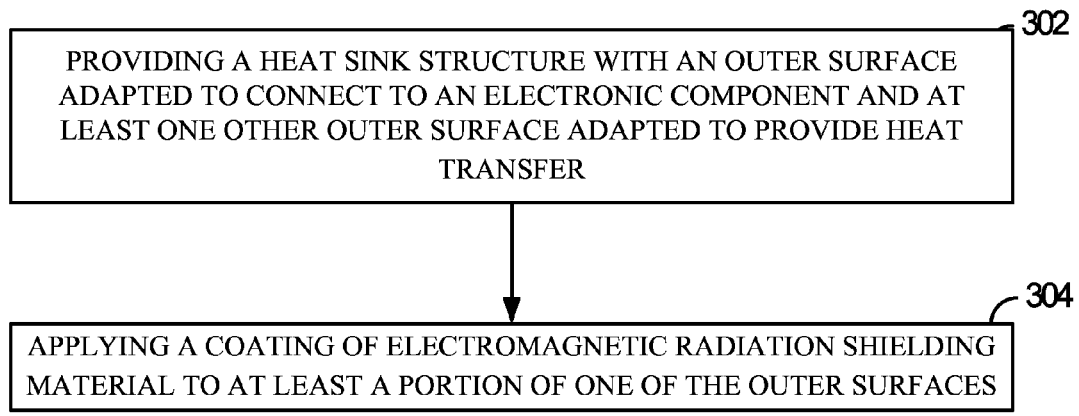
FIG. 3 is a flow chart of a method of creating a heat sink structure with RF absorption, according to an embodiment of the invention.

FIG. 3 is a flow chart of a method of creating a heat sink structure with RF absorption, according to an embodiment of the invention. Block 302 may contain the operation of providing a heat sink structure with an outer surface adapted to connect to an electronic component and at least one other outer surface adapted to provide heat transfer. Block 304 may contain the operation of applying a coating of electromagnetic radiation shielding material to at least a portion of one of the outer surfaces. In other embodiments, the method of FIG. 3 may also include the operation of connecting an electronic component to an exterior surface of the heat sink structure. In other embodiments, the method of FIG. 3 may also include the operation of connecting a fan to an exterior surface of the heat sink structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A heat sink structure comprising:
a conductive material;
a first surface of the conductive material adapted to connect to an electronic component;
a second surface of the conductive material adapted to provide heat transfer away from the electronic component; and a coating of insulative radio-frequency absorbing material covering a first portion of the second surface, the coating of insulative radio-frequency absorbing material not covering a second portion of the second surface.

2. The heat sink structure of claim 1, wherein the second surface is opposite the first surface.

3. The heat sink structure of claim 1, wherein the second surface is adjacent to the first surface.

4. The heat sink structure of claim 1, wherein the second surface includes a plurality of members arranged in a 3D lattice pattern.

5. The heat sink structure of claim 1, wherein the coating of insulative radio-frequency absorbing material is composed of a magnetically loaded elastomer.

6. The heat sink structure of claim 5, wherein the magnetically loaded elastomer is an elastomer infused with ferrite.

7. The heat sink structure of claim 1, wherein the second surface includes a plurality of fins.

8. The heat sink structure of claim 7, wherein the plurality of fins includes outer fins, and wherein the coating of insulative radio-frequency absorbing material covers at least a portion of the outer fins.

9. The heat sink structure of claim 8, wherein the portion of the outer fins includes a top portion of the fins.

10. The heat sink structure of claim 1, wherein the heat sink structure is connected to the electronic component.

11. A heat sink structure comprising:
a first plurality of horizontal members of a conductive material;
a second plurality of horizontal members of the conductive material, the second plurality of horizontal members substantially orthogonal to the first plurality of horizontal members;
a plurality of vertical members of the conductive material, the plurality of vertical members substantially orthogonal to the horizontal members, the horizontal and vertical members arranged in a 3D lattice pattern and having a plurality of interior surfaces of the conductive material and a plurality of exterior surfaces of the conductive material; and
a coating of insulative radio-frequency absorbing material covering at least a portion of one or more of the exterior surfaces, the coating of insulative radio-frequency absorbing material not covering at least a portion of one or more of the interior surfaces.

12. The heat sink structure of claim 11, wherein one of the exterior surfaces of the 3D lattice pattern is thermally connected to an electronic component.

13. The heat sink structure of claim 11, wherein the portion of the surfaces of the 3D lattice pattern that are not covered by the coating of insulative radio frequency absorbing material comprise a higher percentage of all surface areas of the 3D lattice pattern than the portion of the surfaces of the 3D lattice pattern that are covered by the coating of insulative radio frequency absorbing material.

14. A method comprising:
providing a heat sink structure comprising a conductive material, a first surface of the conductive material adapted to connect to an electronic component, and a second surface of the conductive material adapted to provide heat transfer away from the electronic component; and
applying a coating of insulative radio-frequency absorbing material to a first portion of the second surface and not applying the coating to a second portion of the second surface.

15. The method of claim 14, further comprising connecting the electronic component to an exterior surface of the heat sink structure.

* * * * *